United States Patent [19]
Satou et al.

[11] Patent Number: 5,138,196
[45] Date of Patent: Aug. 11, 1992

[54] INTEGRATED SEMICONDUCTOR CIRCUIT

[75] Inventors: Shinzou Satou; Yoshiki Shimauchi, both of Tokyo, Japan

[73] Assignee: Fujitsu Limited, Kawasaki, Japan

[21] Appl. No.: 701,810

[22] Filed: May 19, 1991

[30] Foreign Application Priority Data

May 17, 1990 [JP] Japan .................. 2-127523

[51] Int. Cl.⁵ .................. H03K 19/0175; H03K 19/02
[52] U.S. Cl. .................. 307/446; 307/475
[58] Field of Search ............... 307/475, 455, 446, 570

[56] References Cited

U.S. PATENT DOCUMENTS

| | | | |
|---|---|---|---|
| 4,970,414 | 11/1990 | Ruth, Jr. | 307/446 |
| 5,030,860 | 7/1991 | Tran | 307/446 |
| 5,049,765 | 9/1991 | Young et al. | 307/475 |

Primary Examiner—Edward P. Westin
Assistant Examiner—Andrew Sanders
Attorney, Agent, or Firm—Staas & Halsey

[57] ABSTRACT

A semiconductor integrated circuit has an output circuit which includes a Bi-CMOS circuit of receiving an input signal, and an ECL circuit. The ECL circuit includes a differential pair for receiving an output of the Bi-CMOS circuit, na an emitter follower for receiving an output of the differentail pair. The Bi-CMOS circuit comprises a CMOS inverter connected in series between power sources; a first npn transistor, a diode, and a second npn transistor which are connected in series between the power sources; and second and third n-channel MOS transistors for turning the second npn transistor ON and OFF. This semiconductor integrated circuit provides a stable, operation and low power consumption.

11 Claims, 4 Drawing Sheets

INTEGRATED SEMICONDUCTOR CIRCUIT

BACKGROUND OF THE INVENTION

1. Field of the Invention

The present invention relates to an output circuit of a semiconductor integrated circuit.

2. Description of the Related Art

As the demand for improved an operation speed and a lowering of the power consumption of computers increases, a higher speed and less use of power are required from semiconductor integrated circuits to meet these requirements, a combination of a TTL and Bi-CMOS circuit composed of CMOSs is now under consideration. The speed can be further improved by using a combination of an ECL and a Bi-CMOS circuit.

FIG. 3 shows a simple combination of a Bi-CMOS circuit and ECL according to the prior art. In the figure, MP1 denotes a p-channel MOS transistor and MN1 an n-channel MOS transistor, and these transistors and resistors R1 and R2 are connected in series between power sources VCC (0 V) and VEE ($-5.2$ V). NPN bipolar transistors Q1 and Q2 are connected in series between the power sources VCC and VEE, and the resistors R1 and R2 produce base-emitter voltages of the bipolar transistors Q1 and Q2. These elements form the Bi-CMOS circuit.

The ECL comprises npn bipolar transistors Q3 and Q4, load resistors R3 and R4, and a constant current source including an npn transistor Q5 and a resistor R5. A base of the transistor Q3 is connected to an output end "a" of the Bi-CMOS circuit, a base of the transistor Q4 receives a reference voltage VBB1, and an output of the ECL is picked up from collectors of the transistors Q3 and Q4. In the example of FIG. 3, the output of the ECL is picked up from one collector "b" of the respective collectors of transistors Q3 and Q4 and is applied to a base of an npn transistor Q6 of an emitter follower. A diode Q7 is reversely connected between the power source VCC and an output end OUT, to protect the transistor Q6.

When an input IN is high (H), the MP1 is made OFF, the MN1 is made ON, the Q1 is made OFF, and the Q2 is made ON, and thus the output end a of the Bi-CMOS is made low (L). When the input IN is L, the MP1 is made ON, the MN1 is made OFF, the Q1 is made ON, and the Q2 is made OFF, and thus the output end a is made H. Accordingly, the levels H and L of the input IN are inverted to become levels L and H at the output end a of the Bi-CMOS circuit (a Bi-CMOS inverter); at the output end a, the level H is about VCC (nearly 0 V) and the level L is about VEE (nearly $-5.2$ V).

The H=VCC and L=VEE signals are improper as input signals for the ECL, because the proper inputs for the ECL are usually VIH=$-0.9$ V and VIL=$-1.8$ V. Assuming the output OUT of the ECL is $-0.9$ V for a level H and $-1.8$ V for a level L, a potential at the node b will be $-0.1$ V for the level H and $-1.0$ V for the level L if a base-emitter voltage VBE of the transistor Q6 which is added to the level of the node b, is 0.8 V. When the Bi-CMOS circuit provides a signal amplitude of VIH=VCC=0 V and VIL=VEE=$-5.2$ V, a base voltage (0 V) of the transistor Q3 becomes higher than its collector voltage (-1.0 V) when the node a is level H (with VIH), and thus the transistor Q3 may be saturated.

Further, the reference voltage VBB1 applied to the base of the transistor Q4 is usually $-1.3$ V, and thus VEE ($-5.2$ V) at the node a for the level L is too low, which may cause problems for the withstand voltage of the transistor Q3. Namely, common emitter voltage of the transistors Q3 and Q4 is VBB1−VBE, and therefore, a voltage of VEE−VBB1+VBE is applied as a reverse bias voltage between the base and emitter of the transistor Q3, thereby setting the transistor Q3 to a reverse-biased state.

FIG. 4 shows another prior art circuit which solves the problem of too high an amplitude of the output of the Bi-CMOS. In this example, diodes Q8 and Q9 and a Schottky diode SD1 clamp level L of an output node "a", and the resistor R1 of FIG. 3, are removed to lower the level H of the node a.

When an input IN is high (H) in FIG. 4, the MP1 is made OFF, the Q1 is made OFF, the MN1 is made ON, and the MN2 is made ON, and accordingly, a transistor Q2 is turned ON through a path Q8, Q9, SD1, R6, and MN2, which supplies a base current to the transistor Q2. The logic signal level at the output node a is an L of about $-2.0$ V, which is lower than VCC by the amount of a voltage produced by Q8, Q9, and SD1.

When the input IN is low (L), the MP1 is made ON, the Q1 is made ON, MN1 and MN2 are made OFF, and Q2 is made OFF, and thus the output node a will have an H of about $-0.8$ V, which is lower than VCC by the base-emitter voltage VBE of the transistor Q1. The H and L levels of $-0.8$ V and $-2.0$ V are proper for a reference voltage VBB1 of $-1.3$ V.

Similar to the example of FIG. 3, it is assumed that the levels H and L of an output OUT of FIG. 4 are VOH=$-0.9$ V and VOL=$-1.8$ V, and that the levels H and L at a node "b" are $-0.1$ V and $-1.0$ V, which are higher than the levels of the output OUT by a base-emitter voltage VBE=0.8 V of the transistor Q6. At a level H, the base of the transistor Q3 is $-0.8$ V and the collector thereof $-0.1$ V, and thus the collector voltage cannot fall below the base voltage. Also at a level L, the transistor Q3 presents an emitter voltage of VBB1−VBE = $-2.1$ V and a base voltage of $-2.0$ V, and thus a reverse bias voltage cannot be applied between the base and the emitter. As a result, no problem occurs with the withstand voltage of the transistor Q3.

In FIG. 3, the level H of the output node a substantially reaches VCC because of the resistor R1, and if this resistor is removed, the level can be lowered by the VBE of the voltage transistor Q1. The resistor R1 is necessary, however, for supplying a base current to the transistor Q1, and the resistor R2 is necessary for turning ON the transistor Q2; if the resistors R1 and R2 are removed, it is necessary to provide another circuit for supplying base currents to the transistors Q1 and Q2, and this is why the circuits of FIGS. 3 and 4 have different Bi-CMOS's. In FIG. 4, the base current to the transistor Q1 is supplied through MP1, Q1, Q3, and Q5, and the base current to the transistor Q2 is supplied through Q8, Q9, SD1, R6, and MN2.

The resistors R1 and R2 also function to the bases of the transistors Q1 and Q2 when turning OFF these transistors. In FIG. 4, the transistor MN1 discharges the base of the transistor Q1, and a resistor R7 discharges the base of the transistor Q2 (the resistor R7 is identical to the resistor R2).

As explained above, the example of FIG. 3 provides an excessive amplitude from the Bi-CMOS circuit, thereby saturating the bipolar transistors of the ECL, extending a delay time, and causing a problem with the withstand voltage of the transistors, and thus the circuit of FIG. 3 is not practical.

Further, the diode clamping technique of FIG. 4 may suppress and properly set an input voltage of the ECL, but it consumes unnecessary electric power because a current passes through a path Q8, Q9, SD1, R6, and Q2, and thus the circuit of FIG. 4 cannot satisfy the requirement for a low power consumption.

SUMMARY OF THE INVENTION

An object of the invention is to solve the problems of the conventional techniques by reducing the output amplitude level of a Bi-CMOS to an extent such that it will not saturate bipolar transistors of an ECL, while suppressing a delay time, causing no problem with a withstand voltage, and stabilizing an ECL output level.

Another object of the invention is to adjust the amplitude level of an output signal of a Bi-CMOS circuit to a proper level at which an ECL output circuit operates, thereby providing a reliable and stabilized semiconductor integrated circuit free from malfunctions and consuming less power.

To accomplish the objects, a semiconductor integrated circuit according to a first aspect of the invention has an output circuit including a Bi-CMOS circuit for receiving an input signal, and an ECL circuit. The ECL circuit includes a differential pair for receiving an output of the Bi-CMOS circuit and an emitter follower for receiving an output of the differential pair. The Bi-CMOS circuit of the output circuit comprises a CMOS inverter having a p-channel MOS transistor (MP1), and an n-channel MOS transistor (MN1), which are connected in series between power sources; a first bipolar transistor (Q1), a diode (Q10), and a second bipolar transistor (Q2), which are connected in series between the power sources; and second and third n-channel MOS transistors (MN2, MN3) for turning the second bipolar transistor ON and OFF.

According to a second aspect of the invention, the Bi-CMOS circuit of the output circuit comprises a CMOS inverter having a p-channel MOS transistor (MP1) and an n-channel MOS transistor (MN1), which are connected in series between the power sources; first and second bipolar transistors (Q11, Q12) having a Darlington connection and a third bipolar transistor (Q2), which are connected in series between the power sources; second and third n-channel MOS transistors (MN2, MN3) for turning the third bipolar transistor ON and OFF; and an element connected to the base of the second bipolar transistor, for discharging the second bipolar transistor.

DESCRIPTION OF THE PREFERRED EMBODIMENTS

Figure 1:
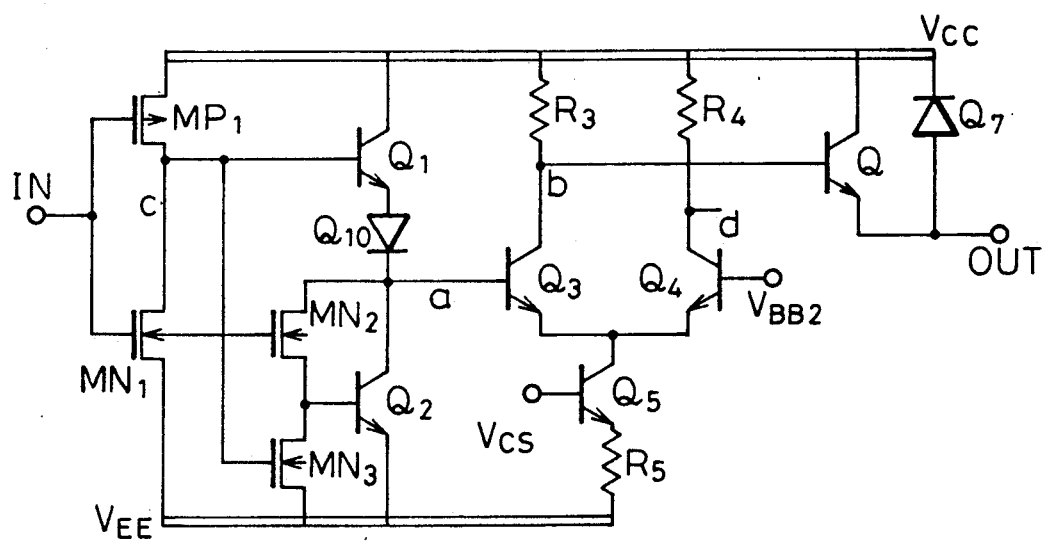
FIG. 1 is a circuit schematic of the output circuit of a semiconductor integrated circuit according to a first embodiment of the invention.

FIG. 1 is a circuit schematic of an output circuit of a semiconductor integrated circuit according to the first embodiment of the invention which employs npn bipolar transistors.

In the figure, a Bi-CMOS circuit of the embodiment comprises a CMOS inverter including a p-channel MOS transistor MP1 and an n-channel MOS transistor MN1, which are connected in series between a high-potential power source VCC and a low-potential power source VEE, an npn transistor Q1, a diode Q10, an npn transistor Q2, and second and third n-channel MOS transistors MN2 and MN3 for turning the npn transistor Q2 ON and OFF.

A base of the transistor Q1 is connected to an output node "c" of the CMOS inverter, and a base of the transistor Q2 is connected to a node of the transistors MN2 and MN3; the transistors MN2 and MN1 receive an input signal IN, and the transistor MN3 receives a voltage at the node c.

Figure 3:
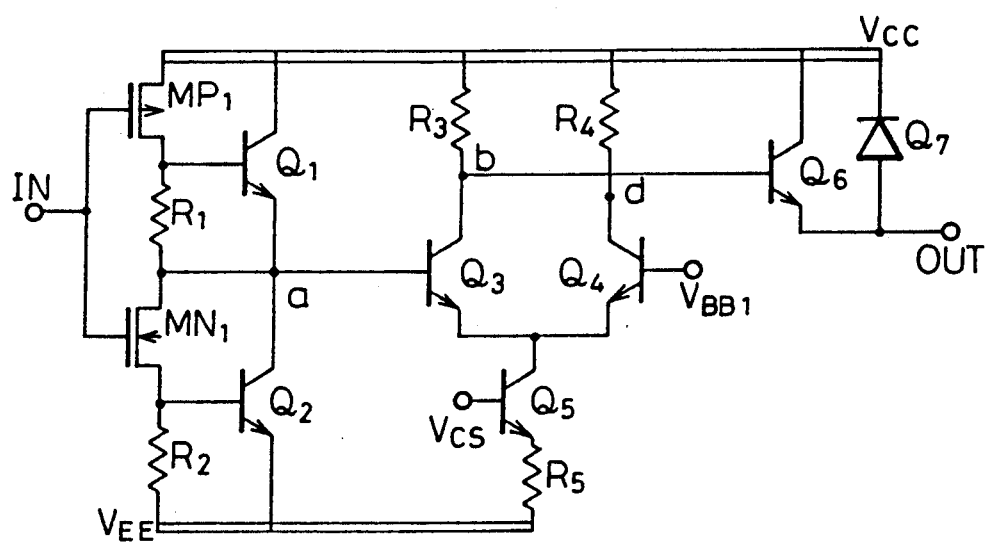
FIGS. 3 and 4 are circuit schematics of output circuits of prior art Bi-CMOS and ECL circuits.
Figure 4:
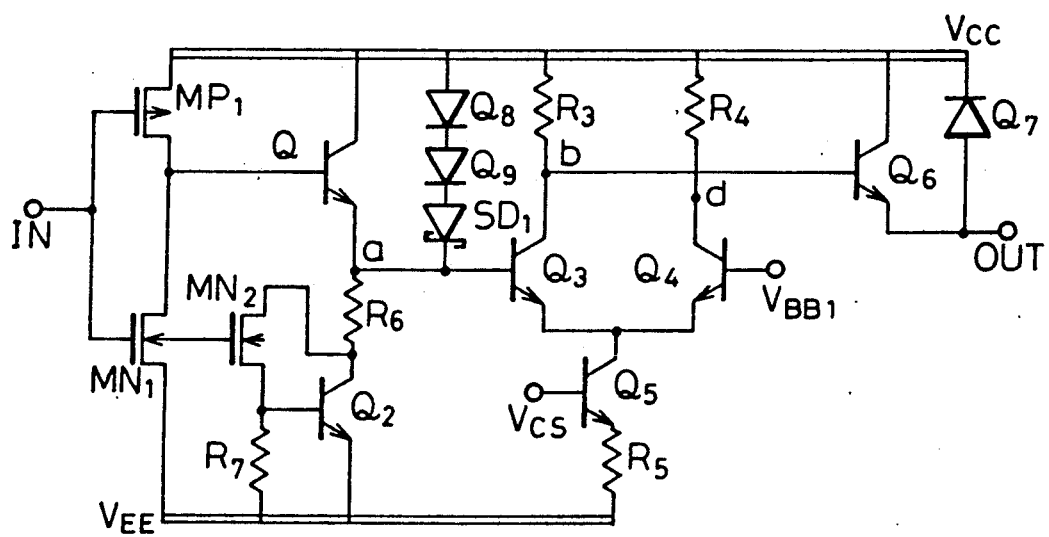

According to the invention, an ECL of the first embodiment includes a pair of differential transistors Q3 and Q4, wherein a base of the transistor Q4 receives a reference voltage VBB2, which is $-2.9$ V compared with the VBB1 = $-1.3$ V of the reference voltage of the conventional examples of FIGS. 3 and 4. The resistors R1 and R2 of the conventional examples are omitted in the first embodiment, of FIG. 1.

According to the first embodiment, the ECL (CML) circuit may be connected in a tree-shape between the power sources VCC and VEE. In this case, the closer a stage is to the bottom, the nearer the reference voltage VBB of the stage approaches VEE. An upper stage (for an upper input) receives a reference voltage VBB1 = $-1.3$ V, and a lower stage (for a lower input) receives a reference voltage VBB2 = $-2.9$ V. A constant current source provides a constant voltage VCS of $-4.0$ V.

The operation of the Bi-CMOS circuit of FIG. 1 will transistor MP1 is made OFF, MN1 is made ON, Q1 is made OFF, MN3 is made OFF, and MN2 is made ON, and thus a node "a" is set to about $-4.4$ V, which is higher than VEE by the base-emitter voltage of the transistor Q2. More precisely, a discharging current of the node a flows through the transistor MN2 and the base and emitter of the transistor Q2 to turn ON the transistor Q2, so that the discharging current can flow through the collector and emitter of the transistor Q2. When the node a drops to VEE+VBE, the base current of the transistor Q2 does not flow, thereby turning the transistor Q2 OFF and stopping the discharging, and as a result, the node a is maintained at VEE +VBE.

When the input signal IN is low (L), the transistor MP1 is made ON, MN1 and MN2 are made OFF, node c is made H, Q1 is made ON, MN3 is made ON, and Q2 is made OFF, thereby setting the node a to $-1.6$ V, which is lower than VCC by the VBE of the transistor Q1 and VF of the diode Q10. Namely, since the transistors Q2 and MN2 are OFF, it is not necessary to flow a useless current to maintain the node a at $-1.6$ V.

In the first embodiment, an output of the ECL circuit is picked up from a collector (i.e., a node b) of the transistor Q3, which is one of the differential pair of transistors Q3 and Q4, and the output is passed through an output stage comprising an emitter follower circuit, and then output from an output end OUT. The output may be picked up from a collector (i.e., a node d) of the other transistor Q4 of the differential pair. Also, it is possible to simultaneously pick up signals from the nodes b and d and output them through two parallel output stages. In this case, an OR signal and a NOR signal may be simultaneously taken out.

To use the output circuit as a cutoff driver, an emitter of a transistor Q6 of the emitter follower circuit of the output stage must be clamped at, for example, −2 V.

The second embodiment of the invention will be explained with reference to FIG. 2.

Figure 2:
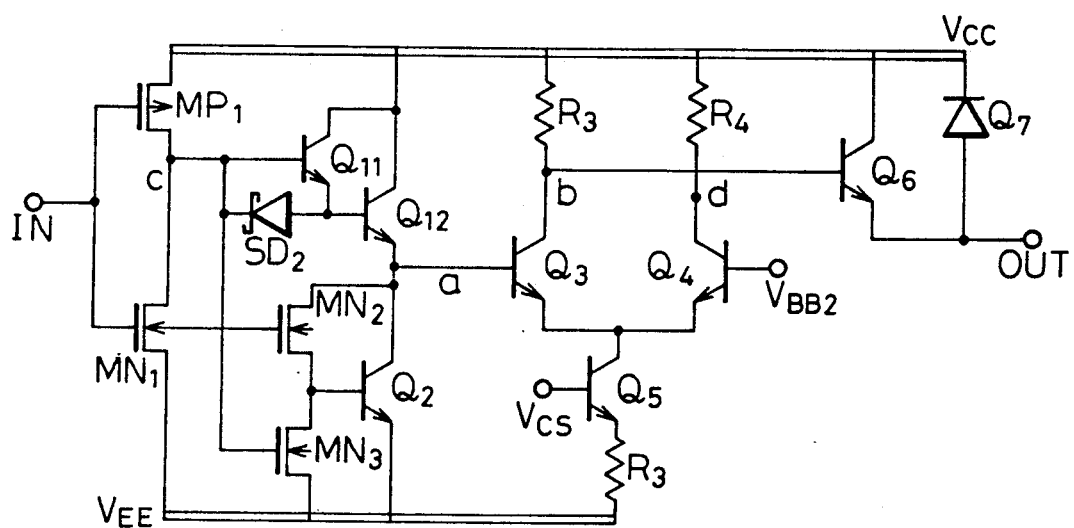
FIG. 2 is a circuit schematic of the output circuit of a semiconductor integrated circuit according to a second embodiment of the invention.

A semiconductor integrated circuit according to the second embodiment, shown in FIG. 2, is basically the same as FIG. 1. Instead of the bipolar transistor Q1 and diode Q10 of the first embodiment, the semiconductor integrated circuit of the second embodiment employs two bipolar transistors Q11 and Q12 having a Darlington connection. To positively discharge the second bipolar transistor Q12, the second embodiment employs an element X, for example, a diode or a Schottky diode SD2, which is connected to a base of the transistor Q12.

In this embodiment, a reference voltage is also −2.9 V, and the resistors R6 and R7 of the conventional circuits are omitted.

The second embodiment also employs npn bipolar transistors.

The operation of the second embodiment is substantially the same as that of the first embodiment. In FIG. 2, when the node a is at level H, it provides a voltage of −1.6 V which is lower than VCC by VBE of the transistors Q11 and Q12. The Schottky diode SD2 discharges the base of the transistor Q12, and when MP1 is OFF and MN1 is ON, the base of the transistor Q12 is discharged through a path of SD2 and MN1.

The operation speed of the embodiment of FIG. 1 may be slow because the diode Q10 suppresses the output voltage amplitude, and thus to improve the operation speed, the embodiment of FIG. 2 employs an element such as the Schottky diode SD2 for a quick discharge of the transistors Q11 and Q12 having a Darlington connection.

As explained above with reference to the first and second embodiments, the output node a of the Bi-CMOS circuit provides −1.6 V for a level H and −4.4 V for a level L which are proper for the reference voltage VBB2=−2.9 V. The levels at the output end OUT are equal to those of the ECL, and are VOH=−0.9 V for a level H and VOL=−1.8 V for a level L, so that levels at the node b are −1.7 V for a level H and −2.6 V for a level L. Therefore, since the node a provides −1.6 V and −4.4 V, the transistor Q3 will not be saturated. With respect to the emitter potential of the transistors Q3 and Q4 of −3.7 V when the transistor Q4 is ON, the voltage of −1.4 V at the base (the node a) of the transistor Q3 is not excessively large, and thus no problem occurs with the withstand voltage of regard to the base and emitter of the transistor Q3.

When the node a is H, the transistor Q2 is made OFF and MN2 is made OFF, so that no current flows therethrough to VEE. When the node a is L, the transistor Q1 (or Q11 and Q12) is made OFF, so that no current flows from VCC to Q1 (or Q11 and Q12). This CMOS operation thus produces no useless current.

In the conventional circuits of FIGS. 3 and 4, the reference voltage VBB for the ECL is VBE1=−1.3 V because, at this voltage, the temperature characteristics are substantially unchanged. To use these conventional circuits as cutoff drivers, the resistor R3, etc., must be changed so that VOL=−2.0 V, and thus substantially no output current flows to establish a TTL high-Z state. In this case, the node d (AND or OR output) is used to provide an output. If the node b (NAND or NOR output) is used, the transistor Q3 may be saturated, or may not be cut off.

Also, in the respective embodiments of the invention of FIGS. 1 and 2, the VBB2 is set to be lower than VBB1 by two times VBE, and an input of the ECL (an output of the Bi-CMOS circuit) is set to be lower than VCC by two times VBE at a level H. This arrangement is advantageous in terms of temperature characteristics. When the arrangement is used as a cutoff driver, it can provide two logical values and AND (OR) and NAND (NOR).

As explained above, the invention can provide a high-speed and low-power-consumption output circuit having a level conversion circuit with Bi-CMOS and ECL circuits, and can greatly improve the performance of computer systems.

We claim:

1. A semiconductor integrated circuit having an output circuit connectable between first and second power sources and including a Bi-CMOS circuit having an input terminal at which an input signal is received and an ECL circuit, the ECL circuit including a differential pair of transistors receiving an output of the Bi-CMOS circuit and an emitter follower receiving an output of the differential pair of transistors, the Bi-CMOS circuit comprising:

a CMOS inverter having a p-channel MOS transistor and an n-channel MOS transistor connected in series between the first and second power sources and defining a first output node therebetween, the respective gates thereof being connected in common to the input terminal and receiving the input signal;

a first bipolar transistor, a diode, and a second bipolar transistor connected in series between the first and second power sources and defining a second output node between the diode and the second bipolar transistor, the base of the first bipolar transistor being connected to the first output node, and second and third n-channel MOS transistors connected in series between the second node and the second power source, with the series connection therebetween connected to the base of the second bipolar transistor and with the corresponding gates thereof connected respectively to the input terminal and to the first node; and the C-MOS inverter and the first bipolar transistor, the diode and the second bipolar transistor being responsive to the level of the input signal for controlling the voltage level of the second node and thereby turning the second bipolar transistor ON and OFF, the voltage level at the second node comprising the output of the Bi-CMOS circuit.

2. A semiconductor integrated circuit having an output circuit connectable between first and second power sources and including a Bi-CMOS circuit having an input terminal at which an input signal is received and an ECL circuit, the ECL circuit including a differential pair of transistors receiving an output of the Bi-CMOS circuit and an emitter follower receiving an output of the differential pair of transistors, the Bi-CMOS circuit comprising:

a CMOS inverter having a p-channel MOS transistor and an n-channel MOS transistor connected in series between the first and second power sources and defining a first output node therebetween, the respective gates thereof being connected in common to the input terminal and receiving the input signal;

Darlington-connected first and second bipolar transistors and a third bipolar transistor connected in series with the Darlington-connected first and second bipolar transistors between the first and second power sources and defining a second output node therebetween, the base of the first bipolar transistor being connected to the first node;

second and third n-channel MOS transistors connected in series between the second node and the second power source, with the series connection therebetween connected to the base of the third bipolar transistor and with the corresponding gates thereof connected respectively to the input terminal and to the first node;

an element connecting the base of the second bipolar transistor to the first node and operative for discharging the second bipolar transistor;

the C-MOS inverter, the Darlington-connected first and second bipolar transistors, the third bipolar transistor and the second and third n-channel MOS transistors being responsive to the voltage level of the input signal for controlling the voltage level at the second node and thereby turning the third bipolar transistor ON and OFF, the voltage level at the second node comprising the output of the Bi-CMOS circuit.

3. A semiconductor integrated circuit as set forth in claim 1, wherein the bipolar transistors are npn bipolar transistors.

4. A semiconductor integrated circuit as set forth in claim 1, wherein the element connected to the base of the second bipolar transistor is a diode or a Schottky diode.

5. A semiconductor integrated circuit as set forth in claim 1, wherein the ECL output circuit is used as a cutoff driver circuit.

6. A semiconductor integrated circuit as set forth in claim 1, wherein a reference voltage to be applied to one of transistors of the differential pair of the ECL circuit is −2.9 V.

7. A semiconductor integrated circuit as set forth in claim 2, wherein the bipolar transistors are npn bipolar transistors.

8. A semiconductor integrated circuit as set forth in claim 2, wherein the ECL output circuit is used as a cutoff driver circuit.

9. A semiconductor integrated circuit as set forth in claim 2, wherein a reference voltage to be applied to one of transistors of the differential pair of the ECL circuit is −2.9 V.

10. A semiconductor integrated circuit ass et forth in claim 5, wherein said first power source is a high potential source and said second power source is a low potential source, and further comprising:

a pair of first and second resistors respectively connecting the collectors of the transistors of the differential pair to the first power source, the respective connections of the pair of resistors and the corresponding collectors of the differential pair of transistors defining third and fourth nodes, the respective signal levels at the third and fourth nodes comprising respective, different output signals of the ECL output circuit.

11. A semiconductor integrated circuit as set forth in claim 8, wherein said first power source is a high potential source and said second power source is a low potential source, and further comprising:

a pair of first and second resistors respectively connecting the collectors of the transistors of the differential pair to the first power source, the respective connections of the pair of resistors and the corresponding collectors of the differential pair of transistors defining third and fourth nodes, the respective signal levels at the third and fourth nodes comprising respective, different output signals of the ECL output circuit.

* * * * *

UNITED STATES PATENT AND TRADEMARK OFFICE
CERTIFICATE OF CORRECTION

PATENT NO. : 5,138,196
DATED : August 11, 1992
INVENTOR(S) : SATOU et al.

It is certified that error appears in the above-indentified patent and that said Letters Patent is hereby corrected as shown below:

On title page, item

[75] Inventors: After "Satou" insert --, Kawasaki-- and change "both of Tokyo," to --Tokyo, both of--;

[22] Filed: Change "May 19, 1991" to --May 17, 1991--;

[57] Abstract, line 5, change "na" to --and--;
    line 6, change "differentail" to --differential--.

Col. 1,   line 9, change "improved an" to --an improved--.

Col. 2,   line 3, after "Namely," insert --the--;
    line 48, change "VBE of the voltage" to --voltage VBE of the--.

Col. 4,   line 35, after "will" insert --be explained. When the input signal IN is high (H), the--.

Col. 5,   line 48, change "-1.4V" to -- -4.4V--.

UNITED STATES PATENT AND TRADEMARK OFFICE
CERTIFICATE OF CORRECTION

PATENT NO. : 5,138,196

DATED : August 11, 1992

INVENTOR(S) : SATOU et al.

It is certified that error appears in the above-indentified patent and that said Letters Patent is hereby corrected as shown below:

Col. 6, line 8, change "values and" to --values of--.

Col. 8, line 13, change "ass et" to --as set--.

Signed and Sealed this

Twenty-fourth Day of May, 1994

*Attest:*

BRUCE LEHMAN

*Attesting Officer*       *Commissioner of Patents and Trademarks*